US009502534B2

(12) United States Patent
Zhong et al.

(10) Patent No.: US 9,502,534 B2
(45) Date of Patent: Nov. 22, 2016

(54) PREPARATION METHOD FOR POWER DIODE

(71) Applicant: CSMC TECHNOLOGIES FAB1 CO., LTD., Wuxi New District (CN)

(72) Inventors: Shengrong Zhong, Wuxi New District (CN); Genyi Wang, Wuxi New District (CN); Xiaoshe Deng, Wuxi New District (CN); Dongfei Zhou, Wuxi New District (CN)

(73) Assignee: CSMC Technologies Fab1 Co., Ltd., Wuxi New District, Jiangsu (CN)

( * ) Notice: Subject to any disclaimer, the term of this patent is extended or adjusted under 35 U.S.C. 154(b) by 0 days.

(21) Appl. No.: 14/902,294

(22) PCT Filed: Sep. 12, 2014

(86) PCT No.: PCT/CN2014/086348
§ 371 (c)(1),
(2) Date: Dec. 30, 2015

(87) PCT Pub. No.: WO2015/043378
PCT Pub. Date: Apr. 2, 2015

(65) Prior Publication Data
US 2016/0308029 A1 Oct. 20, 2016

(30) Foreign Application Priority Data

Sep. 27, 2013 (CN) .......................... 2013 1 0453090

(51) Int. Cl.
*H01L 29/00* (2006.01)
*H01L 29/66* (2006.01)
(Continued)

(52) U.S. Cl.
CPC ..... *H01L 29/66666* (2013.01); *H01L 21/0273* (2013.01); *H01L 21/02576* (2013.01);
(Continued)

(58) Field of Classification Search
CPC ................... H01L 21/31116; H01L 21/32137; H01L 21/32105; H01L 21/0273; H01L 21/26513; H01L 21/266; H01L 21/324; H01L 29/66325; H01L 29/6633; H01L 29/0619; H01L 29/1095; H01L 29/66136
See application file for complete search history.

(56) References Cited

U.S. PATENT DOCUMENTS 4,419,811 A * 12/1983 Rice .................... H01L 29/7816
257/335
4,625,388 A 12/1986 Rice
(Continued)

FOREIGN PATENT DOCUMENTS

CN 102237293 11/2011
CN 102931090 2/2013

OTHER PUBLICATIONS

International Search Report of PCT/CN2014/086348 dated Dec. 12, 2014, and English translation thereof, 6 pages total.

*Primary Examiner* — Kimberly Rizkallah
*Assistant Examiner* — Alexander Belousov
(74) *Attorney, Agent, or Firm* — Hamre, Schumann, Mueller & Larson, P.C.

(57) ABSTRACT

A preparation method for a power diode, comprising: providing a substrate (10), the substrate (10) having a front surface and a back surface opposite to the front surface, an N-type layer (20) growing on the front surface of the substrate (10), and the N-type layer (20) having a first surface deviating from the substrate (10); forming a terminal protection ring (31, 32, 33); forming an oxide layer (50), and performing knot pushing on the terminal protection ring (31, 32, 33); conducting photoetching using a photoetching plate of an active region and etching the oxidation layer (50) of the active region, and forming a gate oxide layer (60) on the first surface of the N-type layer (20) of the active region; depositing on the gate oxide layer (60) to form a polysilicon layer (70); conducting photoetching using a polysilicon photoetching plate, taking a photoresist (40) as a mask layer to inject P-type ions into the N-type layer (20), and forming a P-type body region (82) beneath the polysilicon layer (70) through ion scattering; forming an N-type heavily doped region; forming a P+region; conducting thermal annealing, activating injected impurities and removing the photoresist (40); and conducting metallization processing on the first surface and the back surface of the substrate (10).

10 Claims, 7 Drawing Sheets

(51) Int. Cl.
*H01L 21/02* (2006.01)
*H01L 29/06* (2006.01)
*H01L 21/311* (2006.01)
*H01L 21/28* (2006.01)
*H01L 21/266* (2006.01)
*H01L 21/027* (2006.01)
*H01L 21/265* (2006.01)
*H01L 21/3213* (2006.01)
*H01L 21/324* (2006.01)
*H01L 21/768* (2006.01)
*H01L 29/167* (2006.01)

(52) U.S. Cl.
CPC ....... *H01L21/266* (2013.01); *H01L 21/26513* (2013.01); *H01L 21/28035* (2013.01); *H01L 21/31144* (2013.01); *H01L 21/324* (2013.01); *H01L 21/32139* (2013.01); *H01L 21/768* (2013.01); *H01L 29/0619* (2013.01); *H01L 29/167* (2013.01); *H01L 29/66712* (2013.01); *H01L 21/31116* (2013.01); *H01L 21/32137* (2013.01)

(56) References Cited

U.S. PATENT DOCUMENTS

| | | | |
|---|---|---|---|
| 5,089,434 A * | 2/1992 | Hollinger | H01L 21/033 257/E21.033 |
| 5,891,776 A * | 4/1999 | Han | H01L 29/1095 257/E21.382 |
| 6,724,039 B1 * | 4/2004 | Blanchard | H01L 29/7802 257/328 |
| 8,471,267 B2 * | 6/2013 | Hayashi | H01L 21/045 257/77 |
| 9,252,240 B2 * | 2/2016 | Xu | H01L 21/76213 |
| 9,443,926 B2 * | 9/2016 | Zhang | H01L 29/66333 |
| 2003/0222290 A1 * | 12/2003 | Rodov | H01L 29/1095 257/282 |
| 2009/0085111 A1 | 4/2009 | Sayama | |
| 2011/0220917 A1 * | 9/2011 | Hayashi | H01L 21/045 257/77 |
| 2013/0037878 A1 * | 2/2013 | Wang | H01L 29/0634 257/329 |
| 2013/0119394 A1 * | 5/2013 | Zhu | H01L 29/872 257/76 |
| 2014/0054680 A1 * | 2/2014 | Hashimoto | H01L 21/3242 257/329 |

* cited by examiner

PREPARATION METHOD FOR POWER DIODE

FIELD OF THE INVENTION

The present invention relates to a field of semiconductor device manufacturing technique, particularly relates to a method of manufacturing a power diode.

BACKGROUND OF THE INVENTION

Power diodes are the most basic components of power electronic circuits, because of their unilateral conductivities, power diodes can be used in rectification, clamping and freewheeling of circuits. It is a main subject in power electronic circuits to apply performances of the power diodes rationally. In order to improve the performance of the power diode, devices such as junction barrier control rectifiers, MOS control diodes (MCD) and so on are currently provided both in China and abroad. Metal Oxide Semiconductor Field-Effect Transistor (MOSFET) is a rapidly developed and widely applied electric device, which is a new device optimized by using the fast switching speed and great current density of a vertical double diffused metal oxide semiconductor field effect tube, having characteristics of low forward voltage drop, short reverse recovery time and low leakage current. However, regarding of such structure of MOSFET, the conventional manufacturing process of MOSFET is relatively complex, and the cost is relatively high.

SUMMARY OF THE INVENTION

Accordingly, it is necessary to provide a method of manufacturing a power diode with simple process and low preparation cost.

A method of manufacturing a power diode includes the following steps: providing a substrate, wherein the substrate includes a front side and a back side opposite to the front side; and growing an N-type layer on the front side of the substrate, wherein the N-type layer includes a first surface away from the substrate; forming a terminal guard ring on the first surface of the N-type layer; forming an oxide layer on the first surface of the N-type layer, and performing a driving-in to the terminal guard ring; performing photoetching by using an active region photomask and etching the oxide layer on an active region area, and forming a gate oxide layer on the first surface of the N-type layer on the active region area; depositing a polysilicon layer on the gate oxide layer; performing photoetching by using a polysilicon photomask, implanting P-type ions into the N-type layer by using a photoresist as a masking layer, and forming a P-type body region below the polysilicon layer via ion scattering; etching the polysilicon layer by using the photoresist as the masking layer, implanting N-type ions into the P-type body region below the etched area, and forming an N-type heavily doped region; performing gate oxide layer etching and then silicon etching by using the photoresist as the masking layer, implanting P-type ions below the etched area via ion implantation, and forming a P+ region; performing thermal annealing, activating the implanted impurities and removing the photoresist; and performing metallization processing on the first surface and the back side of the substrate.

In one of embodiments, the step of forming the terminal guard ring on the first surface of the N-type layer includes: forming a thin pad oxide layer on the first surface of the N-type layer, performing photoetching by using the terminal guard ring photomask, implanting P-type ions into the N-type layer by using the photoresist as the masking layer, and forming a P-type terminal guard ring below the thin pad oxide layer.

In one of embodiments, in the step of performing gate oxide layer etching and then silicon etching by using the photoresist as the masking layer, implanting P-type ions below the etched area via ion implantation, and forming the P+ region, a thickness of the etched and removed silicon is 0.15 μm to 0.3 μm.

In one of embodiments, in the step of performing photoetching by using a polysilicon photomask, implanting P-type ions into the N-type layer by using the photoresist as the masking layer, and forming the P-type body region below the polysilicon layer via ion scattering, the P-type ions are boron ions; in the step of etching the polysilicon layer by using the photoresist as the masking layer, implanting N-type ions into the P-type body region below the etched area, and forming the N-type heavily doped region, the N-type ions are As ions; and in the step of performing gate oxide layer etching and then silicon etching by using the photoresist as the masking layer, implanting P-type ions below the etched area via ion implantation, and forming the P+region, the P-type ions include boron ions and $BF_2$ ions.

In one of embodiments, in the step of performing photoetching by using the polysilicon photomask, implanting P-type ions into the N-type layer by using the photoresist as the masking layer, and forming the P-type body region below the polysilicon layer via ion scattering, an implantation energy of the boron ions is 30 KeV to 50 KeV, and a sum of implantation dose of the boron ions is $1\times10^{13}$ $cm^{-2}$ to $5\times10^{13}$ $cm^{-2}$; in the step of etching the polysilicon layer by using the photoresist as the masking layer, implanting N-type ions into the P-type body region below the etched area, and forming the N-type heavily doped region, an implantation energy of the As ions is 30 KeV to 50 KeV, and a sum of implantation dose of the As ions is $1\times10^{15}$ $cm^{-2}$ to $1\times10^{16}$ $cm^{-2}$; and in the step of performing gate oxide layer etching and then silicon etching by using the photoresist as the masking layer, implanting P-type ions below the etched area via ion implantation, and forming the P+ region, an implantation energy of the boron ions is 80 KeV to 100 KeV, and a sum of implantation dose of the boron ions is $1\times10^{13}$ $cm^{-2}$ to $5\times10^{13}$ $cm^{-2}$, while an implantation energy of the $BF_2$ ions is 20 KeV to 40 KeV, and a sum of implantation dose of the $BF_2$ ions is $6\times10^{14}$ $cm^{-2}$ to $1\times10^{15}$ $cm^{-2}$.

In one of embodiments, in the step of performing photoetching by using the polysilicon photomask, implanting P-type ions into the N-type layer by using the photoresist as the masking layer, and forming the P-type body region below the polysilicon layer via ion scattering, the P-type ions are implanted in plural steps.

In one of embodiments, the driving-in is performed in an oxygen-free environment at a temperature of less than or equal to 1100° C., and a driving-in time is 60 minutes to 200 minutes.

In one of embodiments, a thickness of the polysilicon layer is 800 angstrom to 6000 angstrom.

In one of embodiments, a thickness of the N-type layer is 3 μm to 20 μm, and resistivity of the N-type layer is 0.5Ω·cm to 10Ω·cm.

In one of embodiments, the substrate is made of an N-type silicon wafer with an orientation of 100.

The method of manufacturing the power diode described above directly uses the scattering of the implanted ions to form the P-type body region used as a MOS channel before performing polysilicon etching, which can simplify the process and reduce the cost.

DETAILED DESCRIPTION OF THE EMBODIMENTS

The details of one or more embodiments of the invention are set forth in the accompanying drawings and the description below. Other features, objects, and advantages of the invention will be apparent from the description and drawings.

Figure 1:
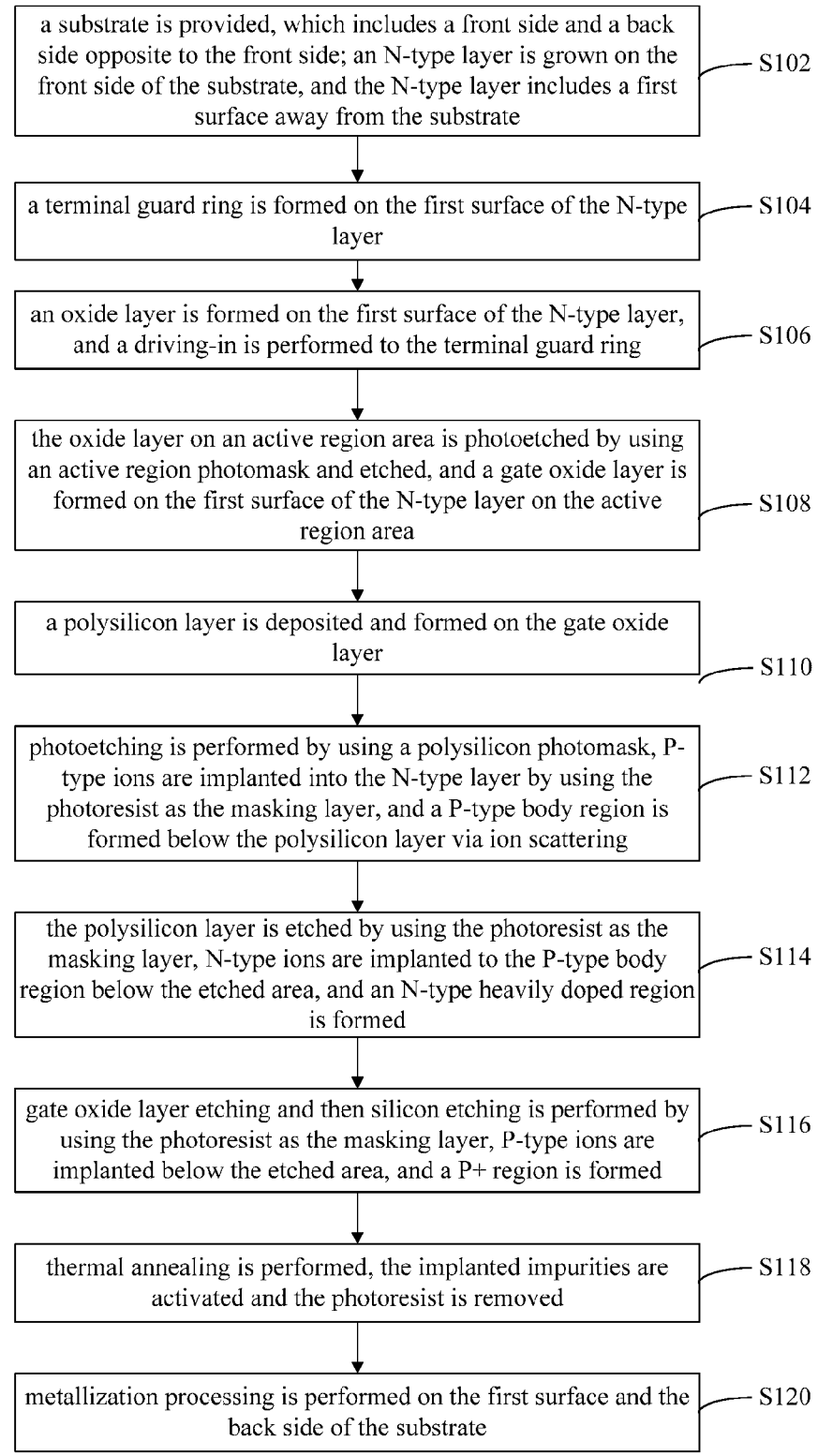
FIG. 1 is a flow chart of a method of manufacturing a power diode in accordance with one embodiment.

FIG. 1 is a flow chart of a method of manufacturing a power diode in accordance with an embodiment, which includes the following steps:

In step S102, a substrate is provided, which includes a front side and a back side opposite to the front side; an N-type layer is grown on the front side of the substrate, and the N-type layer includes a first surface away from the substrate.

The substrate 10 can be made of semiconductor materials such as silicon, silicon carbide, gallium arsenide, indium phosphide or silicon germanium. In the illustrated embodiment, the substrate 10 is an N-type silicon wafer with an orientation of <100>.

In the illustrated embodiment, the N-type layer 20 with a certain thickness and resistivity is epitaxially grown on the front side (a side forming a frontal structure of the power diode) of the substrate 10. A thickness of the N-type layer is 3 μm to 20 μm, and the resistivity is 0.5Ω·cm to 10Ω·cm. The thickness of the N-type layer 20 is determined according to a pressure demand of the power diode being manufactured, in an embodiment, if the power diode is a device with 100V withstand voltage, the thickness of the power diode can be 10 μm, and the resistivity can be 2Ω·cm.

In step S104, a terminal guard ring is formed on the first surface of the N-type layer.

Figure 2:
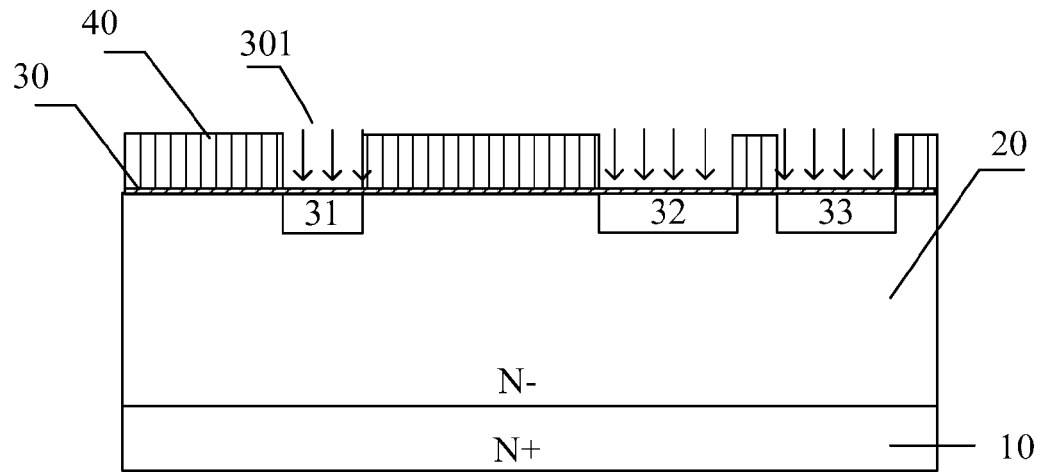
FIGS. 2 to 10 are partial cross-section views during manufacturing the power diode by using the method of manufacturing the power diode in accordance with one embodiment.

Specifically, a thin pad oxide layer 30 is formed on the first surface of the N-type layer, then the thin pad oxide layer 30 is photoetched by using a terminal guard ring photomask, and P-type ions are implanted to the N-type layer by using a photoresist 40 as a masking layer, forming the P-type terminal guard ring below the thin pad oxide layer 30. FIG. 2 shows three terminal guard rings 31, 32, and 33, the terminal guard ring 31 is located at an active region area, and the terminal guard ring 32 is partly located at the active region area. In alternative embodiments, the amount of the terminal guard rings is not limited to the amount of the illustrated embodiment, being able to be selected and arranged according to actual requirement of the device.

In the illustrated embodiment, the implanted P-type ions 301 are boron ions, an implantation energy of the boron ions is 30 KeV to 50 KeV, and a sum of implantation dose of the boron ions is $1\times10^{13}$ cm$^{-2}$ to $5\times10^{13}$ cm$^{-2}$. In alternative embodiments, the boron ions can be replaced by other P-type ions. FIG. 2 is a partial cross-section view of the power diode after finishing step S104.

In step S106, an oxide layer is formed on the first surface of the N-type layer, and a driving-in is performed to the terminal guard ring.

Figure 3:
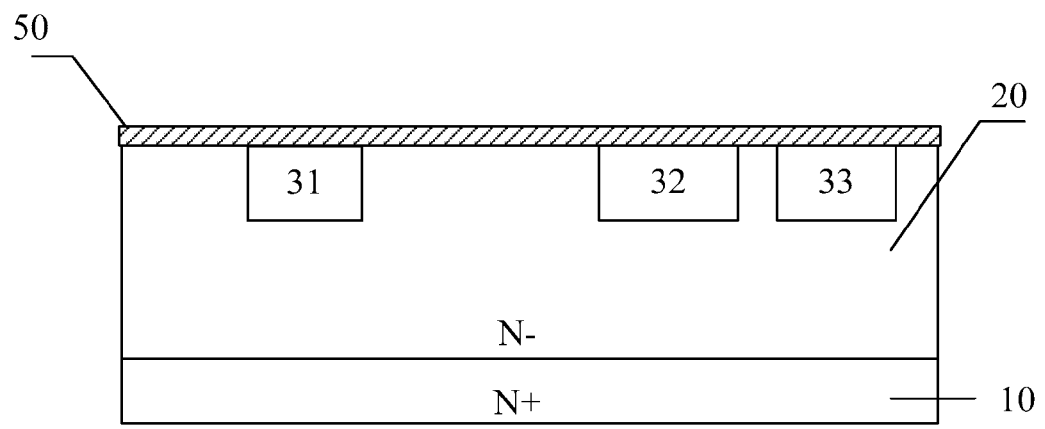

After removing the photoresist 40, the oxide layer 50 with a thickness of 1000 angstrom to 5000 angstrom is deposited, and the driving-in is performed on the P-type terminal guard ring. FIG. 3 is a partial cross-section view of the power diode after finishing step S106. In the illustrated embodiment, the driving-in is performed in an oxygen-free environment at a temperature of less than or equal to 1100☐, and a driving-in time is 60 minutes to 200 minutes. In order to save the cost, in alternative embodiments, this step of forming the oxide layer 50 and driving-in can be combined to a thermal process of aerobic driving-in.

In step S108, the oxide layer on an active region area is photoetched by using an active region photomask and etched, and a gate oxide layer is formed on the first surface of the N-type layer on the active region area.

Figure 4:
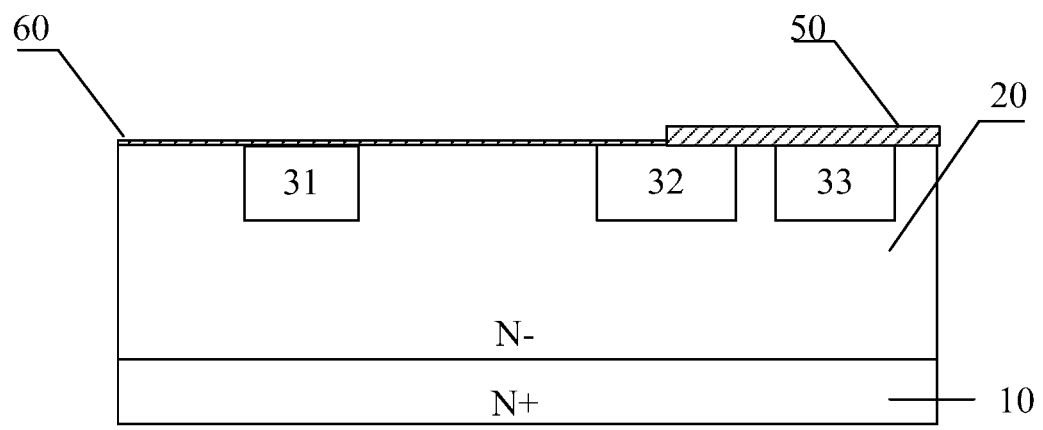

The active region is etched by using the active region photomask on the area for manufacturing the device. After etching the oxide layer 50 on the active region area, the photoresist is removed, and the gate oxide layer 60 is formed via thermal growth. In the illustrated embodiment, a thickness of the gate oxide layer 60 is 20 angstrom to 100 angstrom. FIG. 4 is a partial cross-section view of the power diode after finishing step S108.

In step S110, a polysilicon layer is deposited and formed on the gate oxide layer.

Figure 5:
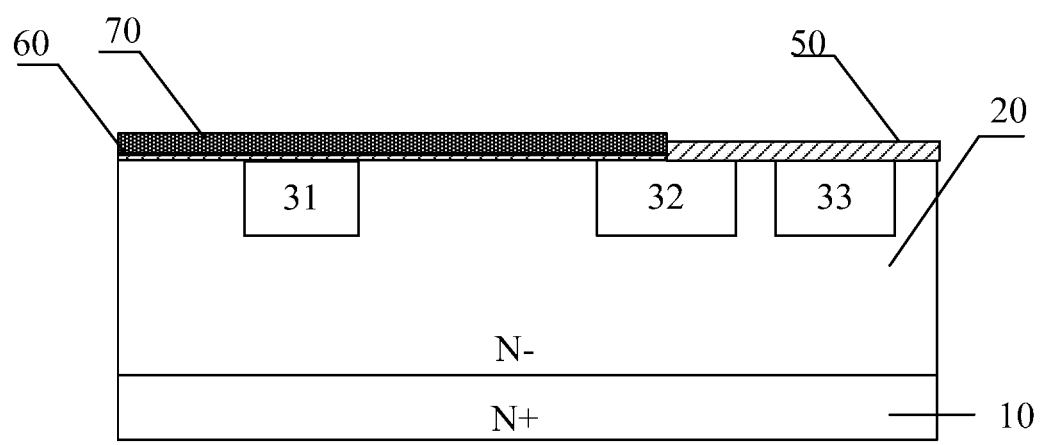

The polysilicon layer 70 is deposited and formed on the gate oxide layer 60. In the illustrated embodiment, the polysilicon layer 70 is in-situ doped polycrystalline silicon with a thickness of 800 angstrom to 6000 angstrom. By adjusting the thickness of the polysilicon layer 70, an impurity distribution of the doping region can be adjusted, and thereby achieves a purpose of reducing the forward voltage drop Vf of the device. FIG. 5 is a partial cross-section view of the power diode after finishing step S110.

In step S112, photoetching is performed by using a polysilicon photomask, P-type ions are implanted into the N-type layer by using the photoresist as the masking layer, and a P-type body region is formed below the polysilicon layer via ion scattering.

Figure 6:
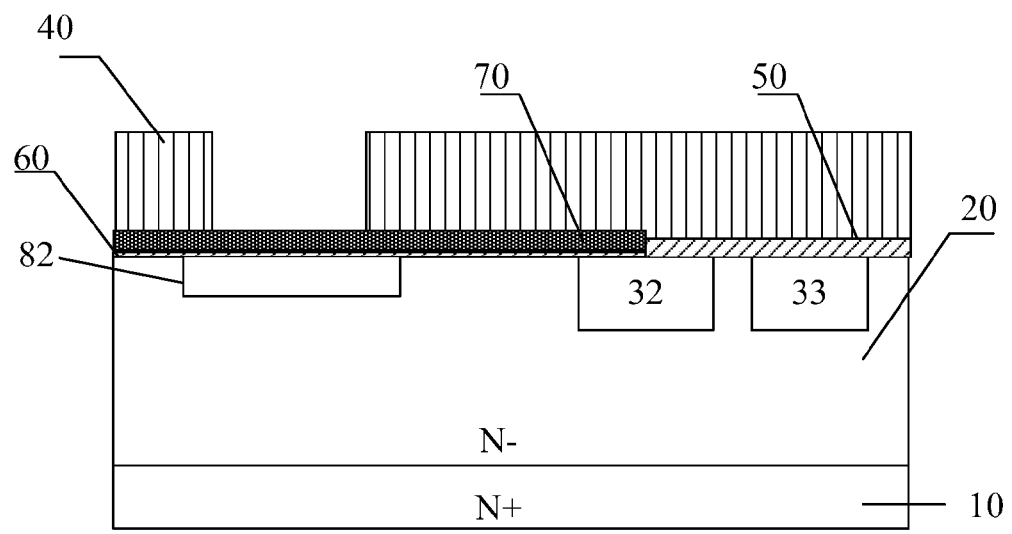

Photoetching is performed by using a polysilicon photomask, P-type ions are implanted into the N-type layer by using the photoresist 40 as the masking layer, and a P-type body region 82 is formed below the polysilicon layer via ion scattering. In the illustrated embodiment, the P-type ions are implanted in plural steps, and the P-type body region 82 is formed as a MOS channel by directly using the transverse scattering of the implanted ions. Specifically, the implanted P-type ions are boron ions, which are implanted in four steps, an implantation energy of the boron ions is 30 KeV to 50 KeV, and a sum of implantation dose of the boron ions is $1\times10^{13}$ cm$^{-2}$ to $5\times10^{13}$ cm$^{-2}$. FIG. 6 is a partial cross-section view of the power diode after finishing step S112.

By directly forming the P-type body region 82 used as a MOS channel via transverse scattering of the implanted ions before performing the polysilicon etching, the process is simplified and the cost is reduced. Moreover, by adjusting the thickness of the polysilicon layer 70 and the energy of the implanted ions, a threshold voltage of the DMOS structure is adjusted, and thereby achieves an adjustment of the forward conduction voltage drop of the diode according to practical applications. In addition, a favorable impurity distribution can be obtained by implanting in plural steps, which reduces the reverse recovery time and improves the performance of the device.

In step S114, the polysilicon layer is etched by using the photoresist as the masking layer, N-type ions are implanted to the P-type body region below the etched area, and an N-type heavily doped region is formed.

Figure 7:
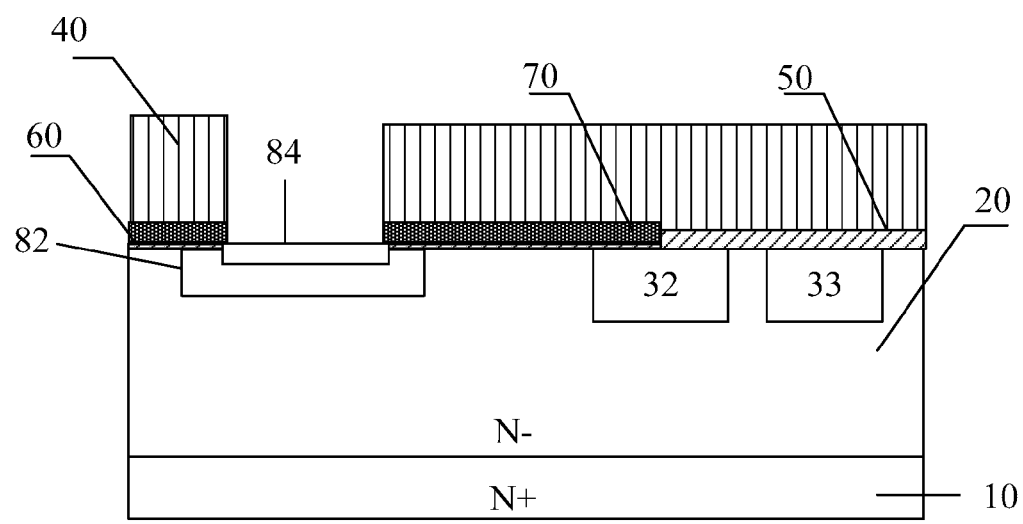

The polysilicon layer 70 is etched by using the photoresist 40 as the masking layer, N-type ions are implanted to the P-type body region 82 below the etched area, and an N-type heavily doped region (NSD) 84 is formed. In the illustrated embodiment, the implanted N-type ions are As ions, an implantation energy of the As ions is 30 KeV to 50 KeV, and a sum of implantation dose of the As ions is $1\times10^{15}$ cm$^{-2}$ to $1\times10^{16}$ cm$^{-2}$. FIG. 7 is a partial cross-section view of the power diode after finishing step S114.

In step S116, gate oxide layer etching and then silicon etching is performed by using the photoresist as the masking layer, P-type ions are implanted below the etched area, and a P+ region is formed.

By using the photoresist 40 as the masking layer, the gate oxide layer 60 and then the silicon are etched, and P-type ions are implanted below the etched area and a P+ region 86 is formed.

Figure 8:
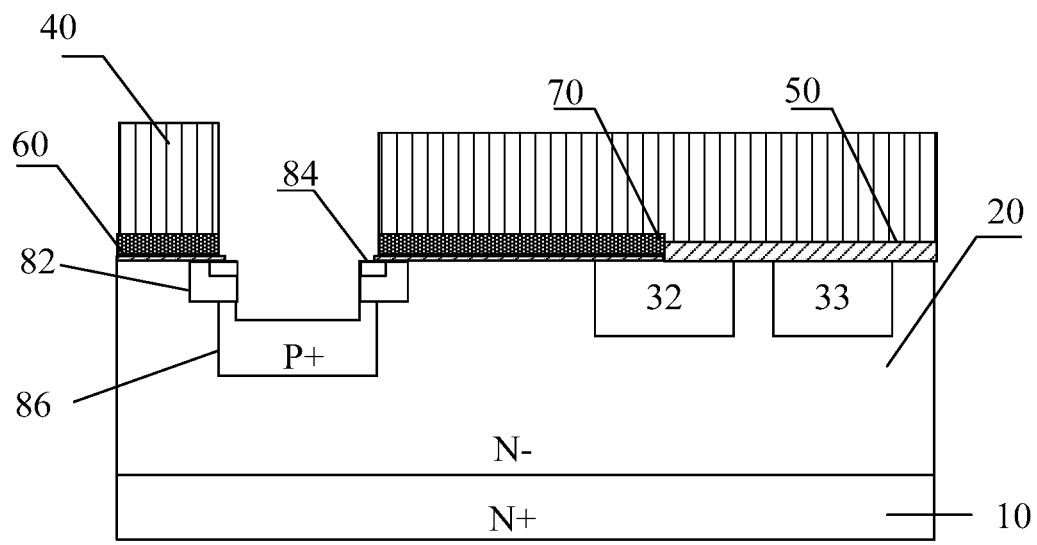

In the illustrated embodiment, during the processing of silicon etching, a thickness of the etched and removed silicon is 0.15 μm to 0.3 μm, forming a shallow slot structure, so as to obtain a relatively good impurity distribution and a greater metal contact area, and improve the performance of the device. The implanted P-type ions include boron ions and BF$_2$ ions. The boron ions are implanted in plural steps, an implantation energy of the boron ions is 80 KeV to 100 KeV, and a sum of implantation dose of the boron ions is $1\times10^{13}$ cm$^{-2}$ to $5\times10^{13}$ cm$^{-2}$, while an implantation energy of the BF$_2$ ions is 20 KeV to 40 KeV, and a sum of implantation dose of the BF$_2$ ions is $6\times10^{14}$ cm$^{-2}$ to $1\times10^{15}$ cm$^{-2}$. A favorable impurity distribution can be obtained by implanting in plural steps, which reduces the reverse recovery time and improves the performance of the device. FIG. 8 is a partial cross-section view of the power diode after finishing step S114.

In step S118, thermal annealing is performed, the implanted impurities are activated and the photoresist is removed.

Figure 9:
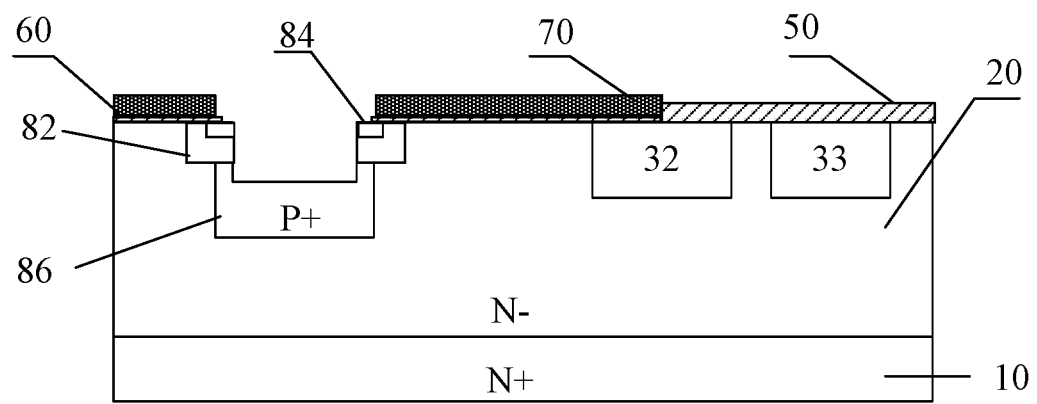

In the illustrated embodiment, the three doping layers P-type body region 82, N-type heavily doped region 84 and the P+ region 86 are rapidly thermal annealed, the implanted impurities are activated and the photoresist 40 is removed. Only one thermal annealing process is used to complete the activating of the impurity in these three doping layers, the process is simplified and the cost is reduced without affecting the performance of the product. In alternative embodiments, a rapidly thermal annealing can be performed after every implantation. FIG. 9 is a partial cross-section view of the power diode after finishing step S116.

In step S120, metallization processing is performed on the first surface and the back side of the substrate.

The oxide layer is etched, and then conductive metal is sputtered on the whole surface of the device. The conductive metal is etched by using a metal photomask, and a metal wire layer 92 is formed, the metallization of the first surface is completed.

Figure 10:
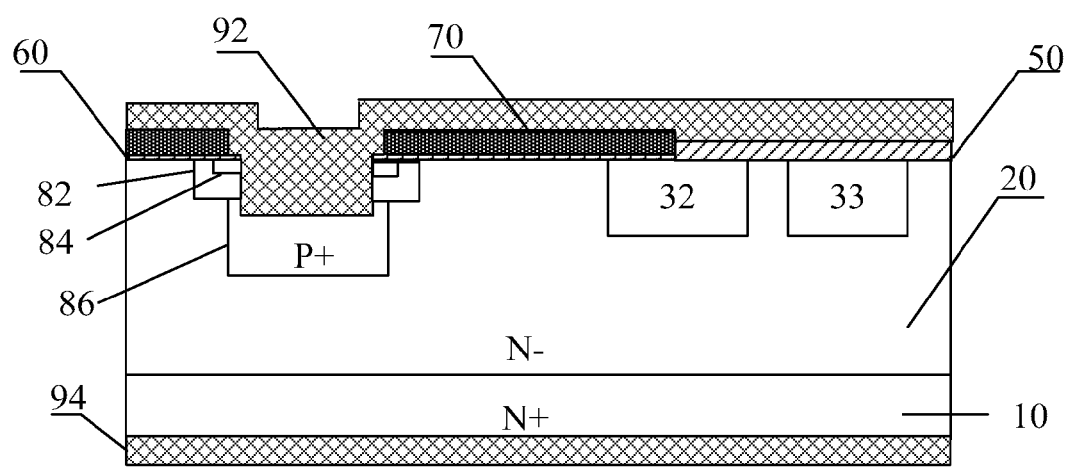

The back side of the surface 10 is ground to obtain a required thickness, the conductive metal is sputtered on the back side of the substrate 10 and a back side metal wire layer 94 is formed, and the metallization of the back side is completed. During the metallization of the first surface and the metallization of the back side, the metal being sputtered includes aluminum, titanium, nickel, silver, copper, etc. FIG. 10 is a partial cross-section view of the power diode after finishing step S120.

Only four photomasks, namely the terminal guard ring photomask, the active region photomask, the polysilicon photomask and the metal photomask are used in the above manufacturing process, which saves one photomask comparing to the conventional manufacturing process, simplifies the process and reduces the cost. The process of the above method of manufacturing a power diode is completely compatible with that of a Double-diffused MOSFET (DMOS), having the advantages of universality and good transferability on different IC production lines.

By implanting P-type ions in plural steps, in the step S112 and the step S116, the above method of manufacturing a power diode can obtain the favorable impurity distribution, reduce the reverse recovery time of the device and improve the switching performance of the device. By directly using the P-type body region 82 formed by the transverse scattering of ion implantation as the MOS channel, the process is simplified and the cost is reduced without affecting the performance of the product.

Figure 11:
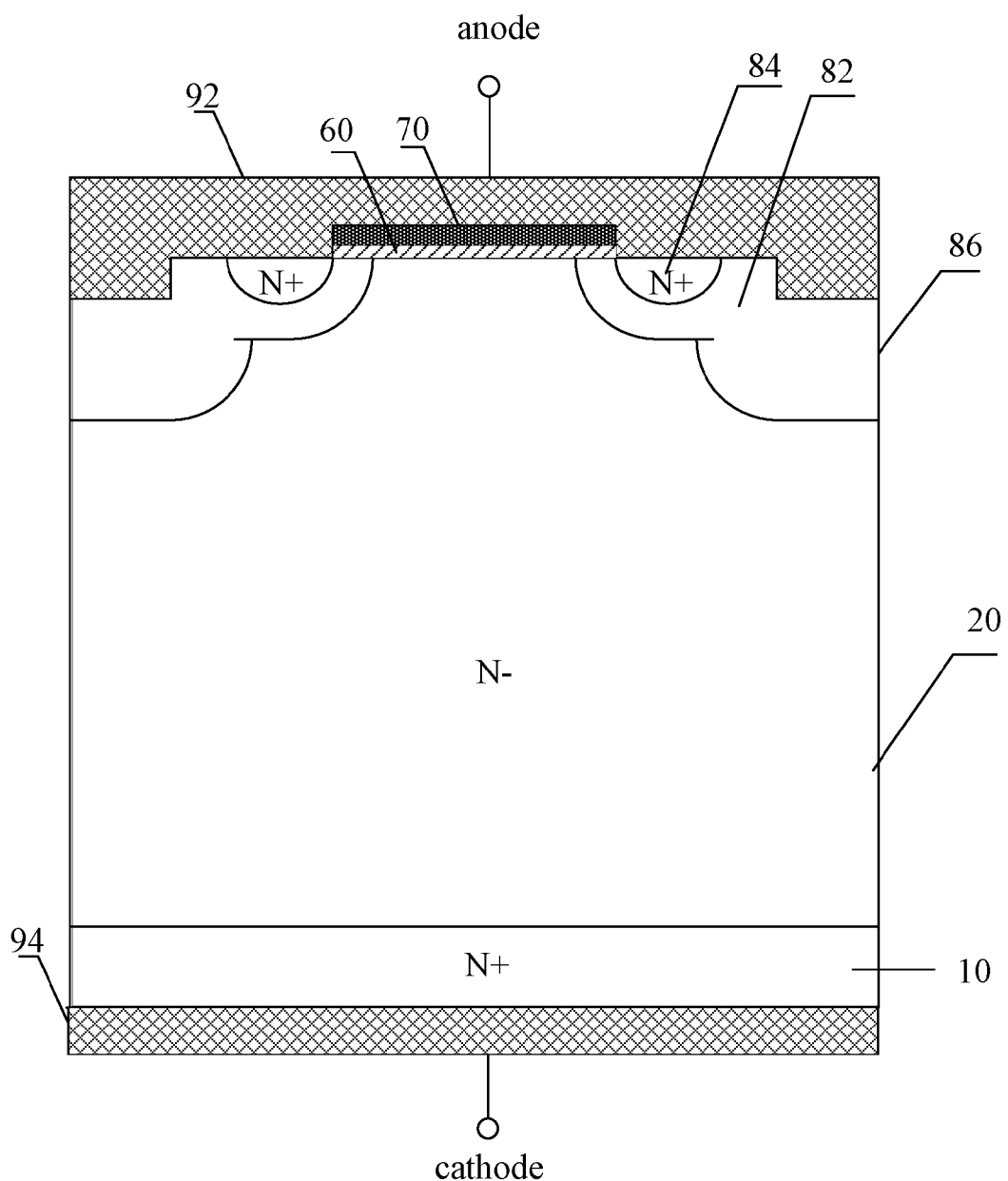
FIG. 11 is a cross-section view of a power diode manufactured by using the method of manufacturing the power diode in accordance with one embodiment.

FIG. 11 is a cross-section view of the power diode manufactured by using the method of manufacturing the power diode in accordance with the embodiment, including peripheral terminal structure (not shown in FIG. 11) and the active region surrounded by the terminal structure. The substrate of the power diode is the N-type substrate 10, the back side of the substrate 10 is provided with the back side metal wire layer 94. The front side of the substrate 10 is provided with the N-type epitaxial layer 20. The terminal guard ring (not shown in FIG. 11) is configured in the terminal structure. The front side (in the same direction with the substrate 10) of the epitaxial layer 20 of the active region is provided with the gate oxide layer 60, and the front side (in the same direction with the substrate 10) of the gate oxide layer 60 is provided with the polysilicon 70. The P-type body region 82 is configured in the epitaxial layer 20 of the active region, and the N-type heavily doped region 84 is configured in the P-type body region 82. The P+ region 86 is configured below the P-type body region 82. The front side (in the same direction with the substrate 10) of the whole device is provided with the front side metal wire layer 92.

Such power diode has several good performance of low opening voltage, short reverse recovery time, low leakage current and high reliability, and can be widely used in AC-DC converter, UPS power supply, automotive electronics, portable electronics, motor drive system and other energy conversion device.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A method of manufacturing a power diode, comprising the following steps:
   providing a substrate comprising a front side and a back side opposite to the front side;
   and growing an N-type layer on the front side of the substrate, wherein the N-type layer comprises a first surface away from the substrate;
   forming a terminal guard ring on the first surface of the N-type layer;

forming an oxide layer on the first surface of the N-type layer, and performing a driving-in to the terminal guard ring;

performing photoetching by using an active region photomask and etching the oxide layer on an active region area, and forming a gate oxide layer on the first surface of the N-type layer on the active region area;

depositing a polysilicon layer on the gate oxide layer;

performing photoetching by using a polysilicon photomask, implanting P-type ions into the N-type layer by using a photoresist as a masking layer, and forming a P-type body region below the polysilicon layer via ion scattering;

etching the polysilicon layer by using the photoresist as the masking layer, implanting N-type ions into the P-type body region below the etched area, and forming an N-type heavily doped region;

performing gate oxide layer etching and then silicon etching by using the photoresist as the masking layer, implanting P-type ions below the etched area via ion implantation, and forming a P+ region;

performing thermal annealing, activating the implanted impurities and removing the photoresist; and performing metallization processing on the first surface and the back side of the substrate.

2. The method of manufacturing the power diode of claim 1, wherein the forming the terminal guard ring on the first surface of the N-type layer comprises:

forming a thin pad oxide layer on the first surface of the N-type layer, performing photoetching by using the terminal guard ring photomask, implanting P-type ions into the N-type layer by using the photoresist as the masking layer, and forming a P-type terminal guard ring below the thin pad oxide layer.

3. The method of manufacturing the power diode of claim 1, wherein in the performing gate oxide layer etching and then silicon etching by using the photoresist as the masking layer, implanting P-type ions below the etched area via ion implantation, and forming the P+ region, a thickness of the etched and removed silicon is 0.15 µm to 0.3 µm.

4. The method of manufacturing the power diode of claim 1, wherein in the performing photoetching by using the polysilicon photomask, implanting P-type ions into the N-type layer by using the photoresist as the masking layer, and forming the P-type body region below the polysilicon layer via ion scattering, the P-type ions are boron ions; in the etching the polysilicon layer by using the photoresist as the masking layer, implanting N-type ions into the P-type body region below the etched area, and forming the N-type heavily doped region, the N-type ions are As ions; and in the step of performing gate oxide layer etching and then silicon etching by using the photoresist as the masking layer, implanting P-type ions below the etched area via ion implantation, and forming the P+ region, the P-type ions comprise boron ions and $BF_2$ ions.

5. The method of manufacturing the power diode of claim 4, wherein in the performing photoetching by using the polysilicon photomask, implanting P-type ions into the N-type layer by using the photoresist as the masking layer, and forming the P-type body region below the polysilicon layer via ion scattering, an implantation energy of the boron ions is 30 KeV to 50 KeV, and a sum of implantation dose of the boron ions is $1 \times 10^{13}$ $cm^{-2}$ to $5 \times 10^{13}$ $cm^{-2}$; in the step of etching the polysilicon layer by using the photoresist as the masking layer, implanting N-type ions into the P-type body region below the etched area, and forming the N-type heavily doped region, an implantation energy of the As ions is 30 KeV to 50 KeV, and a sum of implantation dose of the As ions is $1 \times 10^{15}$ $cm^{-2}$ to $1 \times 10^{16}$ $cm^{-2}$; and in the step of performing gate oxide layer etching and then silicon etching by using the photoresist as the masking layer, implanting P-type ions below the etched area via ion implantation, and forming the P+ region, an implantation energy of the boron ions is 80 KeV to 100 KeV, and a sum of implantation dose of the boron ions is $1 \times 10^{13}$ $cm^{-2}$ to $5 \times 10^{13}$ $cm^{-2}$, while an implantation energy of the $BF_2$ ions is 20 KeV to 40 KeV, and a sum of implantation dose of the $BF_2$ ions is $6 \times 10^{14}$ $cm^{-2}$ to $1 \times 10^{15}$ $cm^{-2}$.

6. The method of manufacturing the power diode of claim 1, wherein in the performing photoetching by using the polysilicon photomask, implanting P-type ions into the N-type layer by using the photoresist as the masking layer, and forming the P-type body region below the polysilicon layer via ion scattering, the P-type ions are implanted in plural steps.

7. The method of manufacturing the power diode of claim 1, wherein the driving-in is performed in an oxygen-free environment at a temperature of less than or equal to 1100° C., and a driving-in time is 60 minutes to 200 minutes.

8. The method of manufacturing the power diode of claim 1, wherein a thickness of the polysilicon layer is 800 angstrom to 6000 angstrom.

9. The method of manufacturing the power diode of claim 1, wherein a thickness of the N-type layer is 3 µm to 20 µm, and a resistivity of the N-type layer is 0.5Ω·cm to 10Ω·cm.

10. The method of manufacturing the power diode of claim 1, wherein the substrate is an N-type silicon wafer with an orientation of 100.

* * * * *